(12) United States Patent
Gentner et al.

(10) Patent No.: US 10,768,232 B2
(45) Date of Patent: Sep. 8, 2020

(54) ATE COMPATIBLE HIGH-EFFICIENT FUNCTIONAL TEST

(71) Applicant: International Business Machines Corporation, Armonk, NY (US)

(72) Inventors: Thomas Gentner, Boeblingen (DE); Jens Kuenzer, Boeblingen (DE); Cedric Lichtenau, Stuttgart (DE); Martin Padeffke, Hemmingen (DE)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 15/649,747

(22) Filed: Jul. 14, 2017

(65) Prior Publication Data

US 2019/0018061 A1    Jan. 17, 2019

(51) Int. Cl.
*G01R 31/319* (2006.01)
*G06F 11/22* (2006.01)
*G01R 31/3181* (2006.01)

(52) U.S. Cl.
CPC ... *G01R 31/31917* (2013.01); *G01R 31/3181* (2013.01); *G01R 31/31905* (2013.01); *G01R 31/31908* (2013.01); *G01R 31/31919* (2013.01); *G06F 11/2236* (2013.01)

(58) Field of Classification Search
None
See application file for complete search history.

(56) References Cited

U.S. PATENT DOCUMENTS

| | | | | |
|---|---|---|---|---|
| 5,701,309 | A * | 12/1997 | Gearhardt | G01R 31/31919 714/736 |
| 6,205,407 | B1 * | 3/2001 | Testa | G01R 31/318307 702/119 |
| 6,651,183 | B1 * | 11/2003 | Gensler, Jr. | G06F 11/0709 714/4.3 |
| 6,748,564 | B1 * | 6/2004 | Cullen | G01R 31/318547 714/728 |
| 6,763,490 | B1 * | 7/2004 | Krech, Jr. | G11C 29/56 702/118 |
| 7,739,566 | B2 | 6/2010 | Armagnat | |
| 9,116,785 | B2 * | 8/2015 | Ferry | G06F 17/00 |
| 9,151,804 | B2 | 10/2015 | Orendi et al. | |
| 9,354,275 | B2 | 5/2016 | Akdemir et al. | |
| 2003/0131294 | A1 | 7/2003 | Motika et al. | |
| 2004/0010741 | A1 * | 1/2004 | Forlenza | G01R 31/318544 714/738 |

(Continued)

*Primary Examiner* — Steve N Nguyen
(74) *Attorney, Agent, or Firm* — Jose A. Medina-Cruz; William H. Hartwell

(57) ABSTRACT

A method, computer program product and/or system is disclosed. According to an aspect of this invention, a device under test (DUT) is switched to a functional test mode. In some embodiments of the present invention, the DUT receives a general scan design (GSD) pattern while in the functional test mode. In some embodiments, the DUT executes a first functional test corresponding to the GSD pattern. In yet other embodiments, the DUT further comprises a state machine that controls the execution of the first functional test. The DUT may further store the output address, the output data, and the status to an address register, a data register, and a status register, respectively and/or send the output address, the output data, and the status to an address register to an automatic testing equipment (ATE).

17 Claims, 5 Drawing Sheets

(56) References Cited

U.S. PATENT DOCUMENTS

| | | |
|---|---|---|
| 2004/0201395 A1* | 10/2004 | Proll .............. G01R 31/318505 324/754.08 |
| 2005/0138500 A1* | 6/2005 | Sul ................... G01R 31/31926 714/724 |
| 2005/0138501 A1 | 6/2005 | Motika et al. |
| 2006/0005091 A1* | 1/2006 | Mitra ............... G01R 31/31816 714/726 |
| 2006/0059387 A1 | 3/2006 | Swoboda et al. |
| 2007/0260823 A1* | 11/2007 | Dickinson ........... G06F 11/2242 711/153 |
| 2008/0028269 A1* | 1/2008 | Imming ............. G01R 31/2834 714/738 |
| 2008/0077835 A1* | 3/2008 | Khoche ............ G01R 31/31724 714/733 |
| 2009/0058450 A1* | 3/2009 | Albert ................ G01R 31/2868 324/750.05 |
| 2011/0078525 A1* | 3/2011 | Xia ................ G01R 31/318563 714/731 |
| 2014/0136914 A1 | 5/2014 | Han et al. |
| 2015/0316605 A1* | 11/2015 | Deutsch ......... G01R 31/318547 702/117 |
| 2016/0313397 A1 | 10/2016 | Whetsel |

* cited by examiner

ATE COMPATIBLE HIGH-EFFICIENT FUNCTIONAL TEST

BACKGROUND

The present invention relates generally to the field of hardware testing, and more particularly to standard functional testing of processor hardware chips in an automatic test pattern generation (ATPG) environment.

Automatic test equipment (ATE) refers to apparatuses and methods designed to perform tests on a variety of devices such as semiconductors, microprocessors, and other similar hardware. An ATE uses control systems and automated information to perform tests on a device referred to as a device-under-test (DUT). The ATE monitors the execution of the tests, measures the results, and evaluates the DUT. In general, the objective of an ATE is to confirm whether a DUT works as intended and/or to identify manufacturing defects.

SUMMARY

According to an aspect of the present invention, there is a method, computer program product and/or system that performs the following operations (not necessarily in the following order): (i) switching a device under test (DUT) to a functional test mode; (ii) receiving, by the DUT, a general scan design (GSD) pattern; and executing, by the DUT, a first functional test corresponding to the GSD pattern. The DUT further comprises a state machine that controls the execution of the first functional test.

BRIEF DESCRIPTION OF THE DRAWINGS

The following detailed description, given by way of example and not intended to limit the disclosure solely thereto, will best be appreciated in conjunction with the accompanying drawing, in which.

DETAILED DESCRIPTION

Figure 1:
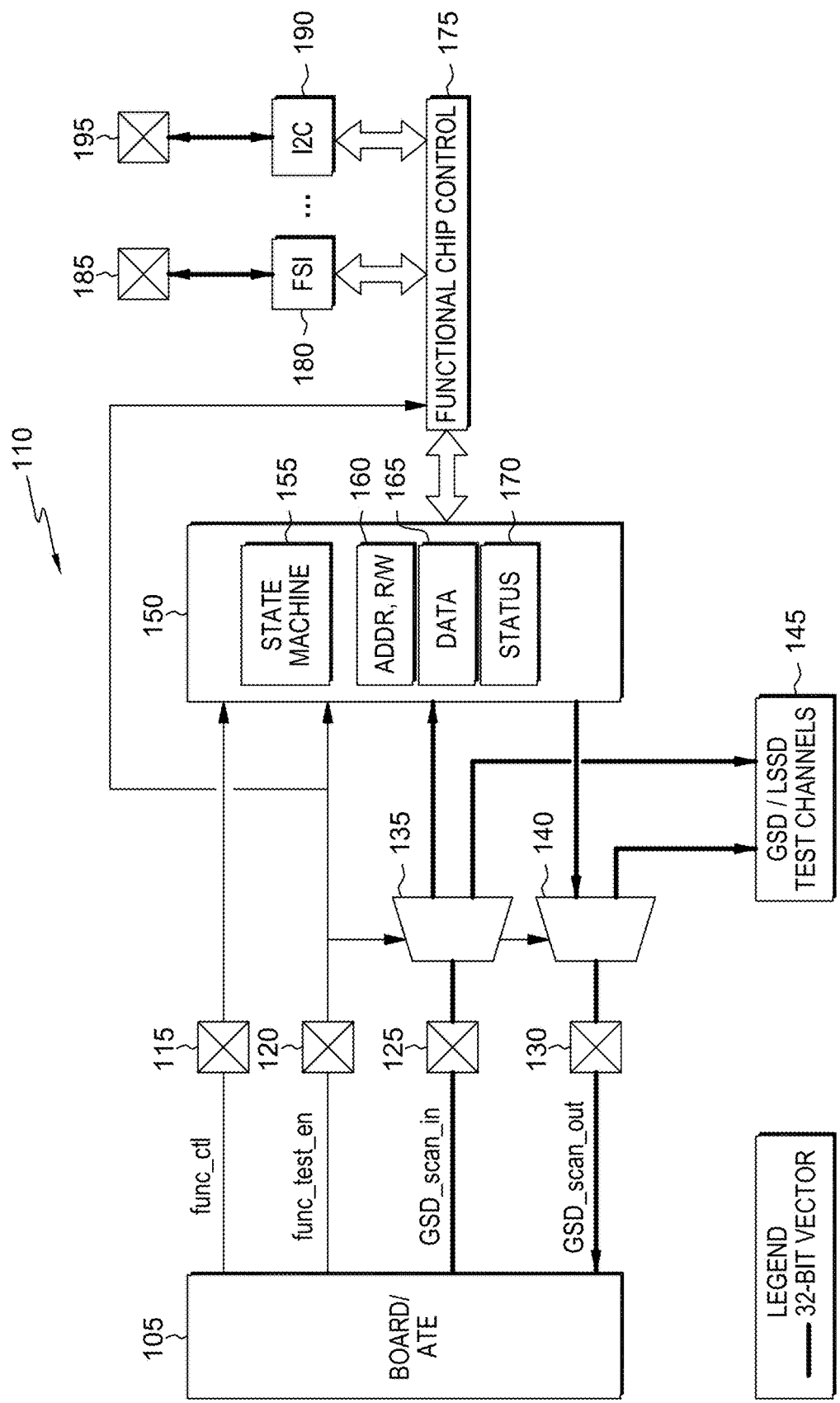
FIG. 1 depicts a device under test (DUT) configuration, in accordance with an embodiment of the present invention.

A method and apparatus to translate standard functional tests is hereby disclosed. The method and apparatus may execute standard functional tests in an Automatic Test Pattern Generation (ATPG) environment by reusing the standard parallel general scan design (GSD) interface and by implementing a small internal state machine in the chip to interpret the GSD pattern and execute the correspondent functional instruction in the chip. The traditional GSD interface may be used to execute functional commands or used to execute a functional test. The method and apparatus may also convert a standard functional test to an ATE environment pattern to allow execution of back-to-back tests without scan reload and/or phase-locked loop (PLL) locking.

Functional testing of highly integrated chips can be preferred over other, classical test methods like ATPG or Logic Built-In Self-Test (LBIST), which are not representative of functional conditions. Functional testing in an Automatic Testing Equipment (ATE) is different from functional execution mode in a chip and generally requires a full custom development, verification, and testing environment causing significant extra development effort.

A classical approach for functional testing uses a GSD scan load pattern for simulation of functional tests. This approach typically requires the following steps: (1) extract checkpoint, (2) scan load initial state, (3) start execution. This classical approach requires development of an iterative pattern, development of unique patterns for checkpoints, and a separate verification effort. However, this classical approach results in error prone, fragile execution, and provides functional tests that are hard to modify.

In a Flexible Service Processor (FSP) driven approach, the functional test is driven by an external service processor that mimics functional machine behavior. The FSP driven approach requires custom external hardware for each tester and may be slow due to overhead attributed to the service processor. This approach further requires special configuration of the service processor.

Another approach involves reuse of a serial functional interface under tester control. This approach works by emulating the serial protocol of an external service processor via test patterns. However, this approach is slow due to the large number of test vectors necessary and only works with ATE environments that support memory pooling. Additionally, it may be hard to modify test patterns because of Error-Correcting Code (ECC) memory protections.

Therefore, it is advantageous to apply the default functional test sequences in an ATE environment using standard parallel GSD interface without extra adaptation, customer rewrite, and testing. It is also advantageous to provide a test that can be easily modified without having to spend significant simulation time and test pattern assembly.

To overcome the challenges described, some embodiments of the present invention disclose a method and apparatus to translate standard functional tests. In these and other embodiments, the method and apparatus execute standard functional tests in an ATPG environment by reusing the standard parallel GSD interface and by implementing a small internal state machine in the chip to interpret the GSD pattern and execute the correspondent functional instruction in the chip. In other embodiments, the GSD interface may be used to execute functional commands. In still other embodiments, the GSD interface may be used to execute a functional test. In yet other embodiments, the method also converts a standard functional test to an ATE environment pattern. In these and other embodiments, back-to-back tests may be executed without scan reload and/or PLL locking.

Some embodiments of the present invention may include one, or more, of the following features, characteristics and/or advantages: (i) standard pre-validated functional tests; (ii) application of functional tests via a standard GSD interface; (iii) optimized pattern build and execution time; (iv) maximized tester memory usage; (v) easy assembly and modification of single parts of the functional tests; (vi) back-to-back tests without scan initialization and/or PLL lock loop; (vii) easily modifiable, human-readable test patterns; (viii) reduced test time by parallel pattern application;

(ix) no special external hardware required because of the use of a small internal state machine.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

FIG. 1 depicts a device under test (DUT) configuration, in accordance to an embodiment of the present invention. In this exemplary embodiment, ATE 105 is operatively connected (i.e., coupled) to device under test (DUT) 110 via func_ctl pin 115, func_test_en pin 120, GSD_scan_in pin 125, and GSD_scan_out pin 130. ATE 105 enables functional testing in DUT 110 via func_test_en pin 120 by setting func_test_en pin 120 to one (1). ATE 105 further sends functional commands to DUT 110 via func_ctl pin 115. In this and other embodiments, DUT 110 may be any integrated chip (e.g., custom design chips, ASICs, FPGs, and others) which has command-based infrastructure in accordance to the present invention.

ATE 105 additionally sends an input payload to DUT 110 via GSD_scan_in pin 125. Input multiplex circuit 135 may select input from GSD_scan_in pin 125 to be directed into GSD/LSSD test channels 145 or test control registers 150. Conversely, ATE 105 receives an output payload from DUT 110 via GSD_scan_out pin 130. Output multiplex circuit 140 may select output from GSD/LSSD test channels 145 or test control registers 150 to be directed into GSD_scan_out pin 130. GSD/LSSD test channels 145 include traditional test channels for execution of functional tests. In some embodiments of the present invention, GSD_scan_in pin 125, GSD_scan_out pin 130, and GSD/LSSD test channels may comprise a plurality of communication channels (e.g., 32-bit vectors).

Test control registers 150 includes state machine 155, address register 160, data register 165, and status register 170.

State machine 155 is a simple machine that tracks of the functional commands executed in DUT 110. For example, state machine 155 controls the initialization of execution, addresses to be monitored at DUT 110, captured data from DUT 110, and status of the functional commands executed on DUT 110, among other states.

Address register 160 specifies addresses of DUT 110 to be tested or monitored. In an input payload, for example, address register 160 may specify the address of the part of the chip to be tested. In an output payload, address register 160 may specify the address of the part of the chip being monitored for output.

Data register 165 specifies the input/output data of the functional command or the output data of the functional command. In an input payload, for example, data register 165 may specify the input data to be used by the functional command. In an output payload, data register 165 may specify the output of the functional command or the contents of the output address specified by address register 160.

Status register 170 specifies the status of the functional command at the end of execution. For example, status register 170 specifies whether the functional command succeeded, whether the functional command failed, or whether the functional command is still executing.

Functional chip control 175 translates the payload received via GSD_scan_in pin 125 into functional commands that can be performed by DUT 110. Functional chip control 175 further transfers the functional commands to the appropriate part of DUT 110 (e.g., the part of the chip that will be tested). In some embodiments of the present invention, the payload includes a functional command to initialize execution of the test. In these and other embodiments, the payload further specifies the part of the chip that will be monitored in this test and the data to be used by the functional command as input by reference to address register 160 and data register 165. Functional chip control further monitors execution of the functional command and writes the status of the functional command in status register 170.

Functional chip control 175 is further operatively connected to other devices (not shown) through flexible services interface (FSI) 180 and inter-integrated circuit (I2C) 190, among other interfaces (not shown). In some embodiments of the present invention, functional chip control 175 may receive further functional commands and data from additional devices (not shown) via FSI 180 and I2C 190. Additional devices (not shown) may be connected to DUT 110 via FSI pin 185 or I2C pin 195.

Figure 2:
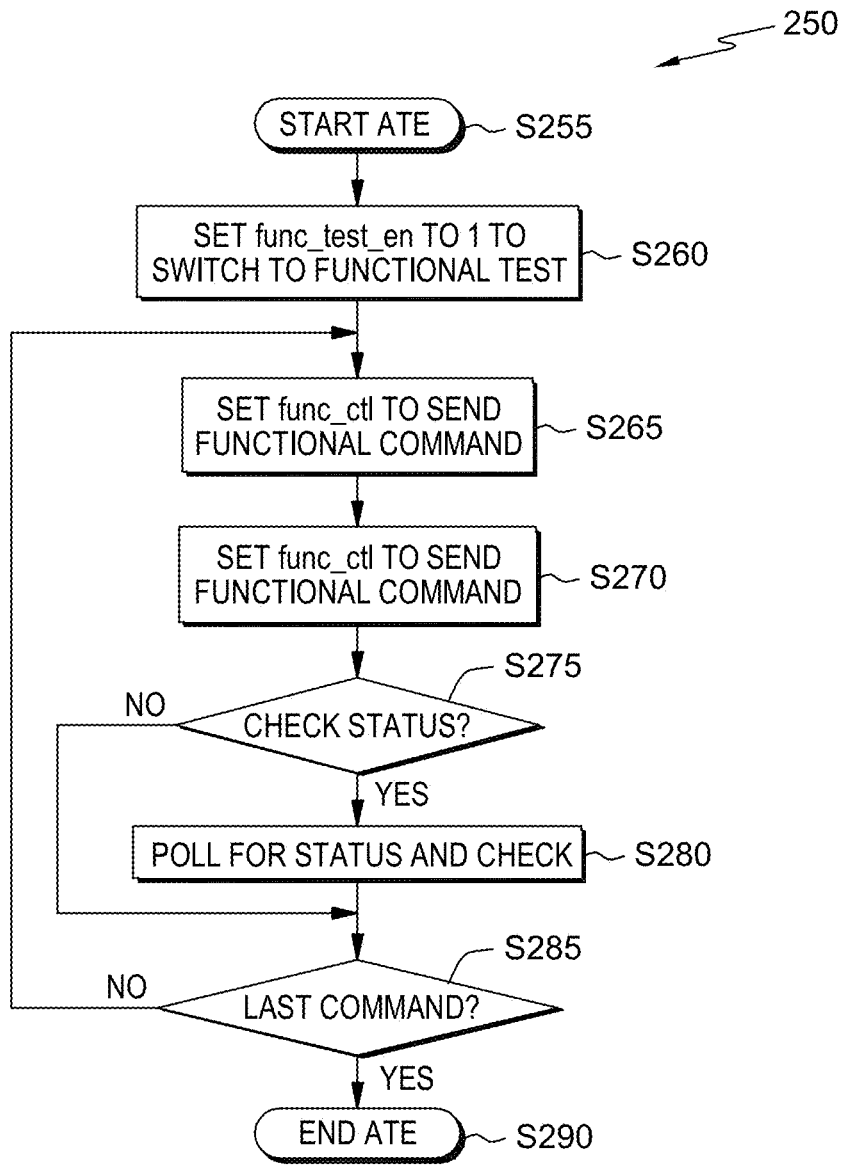
FIG. 2 is a flowchart showing depicting operational steps of an automatic testing equipment (ATE), in accordance with an embodiment of the present invention.
Figure 3:
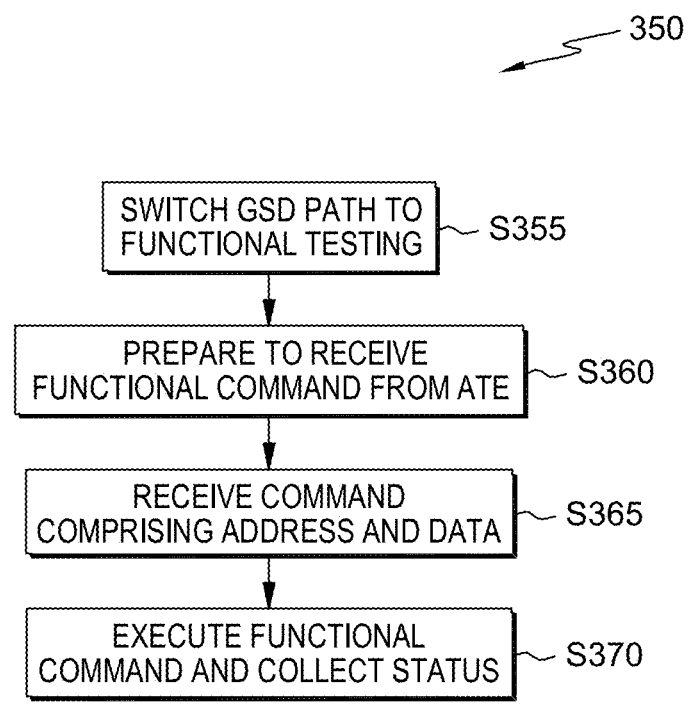
FIG. 3 is a flowchart showing depicting operational steps of a device under test, in accordance with an embodiment of the present invention.

FIG. 2 shows flowchart 250 depicting an approach performed on ATE 105 according to an embodiment of the present invention. FIG. 3 shows flowchart 350 further depicting an alternate approach performed on DUT 110 according to an embodiment of the present invention. These approaches will now be discussed, over the course of the following paragraphs, with extensive reference to FIG. 2 (for the ATE 105 operation blocks) and FIG. 3 (for the DUT 110 operation blocks).

In reference to FIG. 2, processing begins at operation S255, where ATE 105 is initialized for execution of one or more functional tests in DUT 110. In some embodiments of the present invention, functional tests may include ABIST (Array built-in self test), LBIST (Logic built-in self test), and AVP (Architectural Verification Program), among others. For any of these tests, ATE 105 is initialized to set up, start execution, monitor for completion, and eventually retrieve the results of the functional tests. During initialization, all parts of ATE 105 are set to known states and test patterns are loaded for transfer to DUT 110. For example, ATE 105 may perform an initialization sequence to activate the DUT 110 safely. The initialization may include setting the correct environmental conditions (e.g., temperature, voltage, frequencies) and setting the correct states of the pins of DUT 110.

Processing proceeds to operation S260, where ATE 105 sets func_test_en pin 120 to one (1) to switch the DUT 110 to a functional test mode. In some embodiments of the present invention, DUT 110 is placed in a functional test mode where it is ready to receive functional commands from ATE 105.

Processing proceeds to operation S265, where ATE 105 sends a functional command to DUT 110 via func_ctl pin 115. In some embodiments of the present invention, DUT 110 may send a payload to DUT 110 via GSD_scan_in pin 125. For example, ATE 105 may send a functional test pattern via GSD_scan_in pin 125.

Processing continues to operation S270, where ATE 105 sends an additional functional command to DUT 110 via func_ctl pin 115. In some embodiments of the present invention, ATE 105 may send the specific payload to DUT 110 via GSD_scan_in pin 125 required to execute the desired functional test pattern.

Processing proceeds to operation S275, where ATE 105 determines whether it is necessary to check the status of the functional commands sent to DUT 110. Status check is necessary, for example, when the functional command is expected to return a status after execution (e.g., success status, failure status, or similar status). In some embodiments of the present invention, functional chip control 175 executes the functional command immediately and writes the status of the functional command in status register 170 as soon as the functional command is done executing. In the event ATE 105 determines that checking the status of the functional tests running in DUT 110 is necessary (operation S275, "yes" branch), ATE 105 polls DUT 110 for status of the functional tests (operation S280). Polling is necessary, for example, when the functional command executed by functional chip control 175 takes longer to execute than it takes for ATE 105 to check the status. In those cases, ATE 105 may wait a predetermined amount of time before checking status register 170 again.

In the event ATE 105 determines that checking the status of the functional tests is not necessary (operation S275, "no" branch), ATE 105 determines whether there are more functional commands to be executed by DUT 110 (operation S285). If there are more functional commands to be executed by DUT 110 (operation S285, "yes" branch), processing resumes at operation S265, where ATE 105 sends functional commands to DUT 110 (operation S265). If there are no more functional commands to be executed by DUT 110 (operation S285, "no" branch), processing continues to operation S290, where ATE 105 clears all states and test patterns and ceases execution (operation S290).

Referring to FIG. 3, processing begins at operation S355, where DUT 110 switches the GSD path to a functional testing mode in response to operation S255. For example, switching the GSD path to functional testing mode may require initialization of state machine 155, address register 160, data register 165, and status register 170.

In response to operation S260, processing proceeds at operation S360, where DUT 110 prepares to receive a functional command from ATE 105. In some embodiments of the present invention, preparing to receive a functional command may require receiving a functional test pattern via GSD_scan_in pin 125.

In response to operation S265, processing continues at operation S365, where DUT 110 receives a command comprising an addr, r/w, and data from ATE 105 via GSD_scan_in pin 125. In some embodiments of the present invention, DUT 110 may receive the specific payload from ATE 105 via GSD_scan_in pin 125 required to execute the desired functional test pattern. In some embodiments, the payload is written into the address register 160 and data register 165 for access by functional chip control 175.

Processing continues at operation S370, where DUT 110 executes the functional command and collects the status of the functional command. In some embodiments of the present invention, functional chip control 175 translates the payload received via GSD_scan_in pin 125 into functional commands that can be performed by DUT 110. Functional chip control 175 further transfers the functional commands to the appropriate part of DUT 110 (e.g., the part of the chip that will be tested). In some embodiments of the present invention, the payload includes a functional command to initialize execution of the test. In these and other embodiments, the payload further specifies the part of the chip that will be monitored in this test and the data to be used by the functional command as input by reference to address register 160 and data register 165. Functional chip control may further monitor execution of the functional command and write the status of the functional command in status register 170.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of an automatic testing equipment (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

Figure 4:
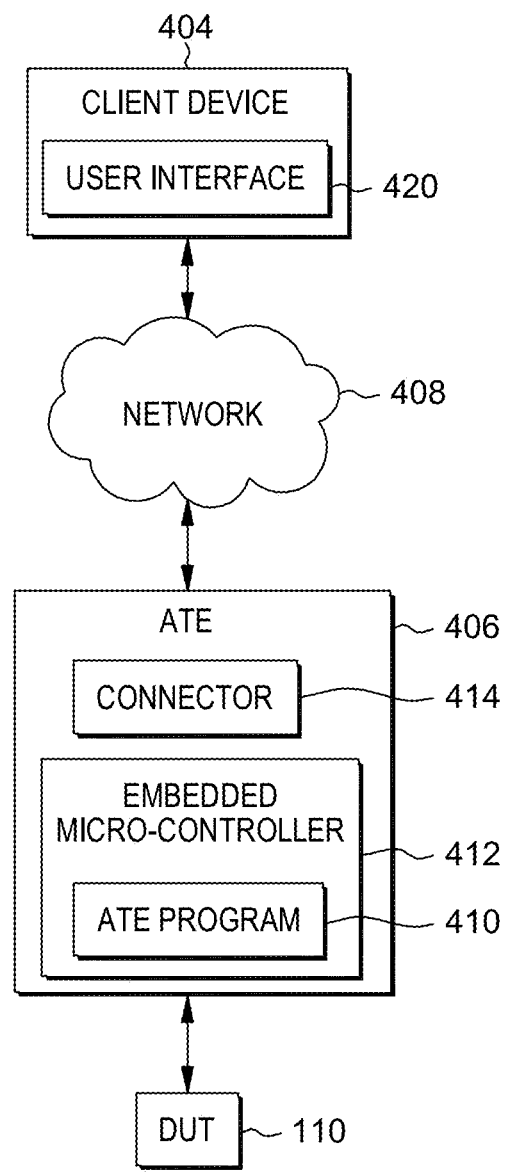
FIG. 4 is a functional block diagram illustrating a distributed data processing environment, in an embodiment, in accordance with the present invention.

FIG. 4 is a functional block diagram illustrating a distributed data processing environment, in an embodiment in accordance with the present invention. The distributed data processing environment includes ATE 406 and DUT 110, all interconnected over network 408.

Client device 404 may be a laptop computer, tablet computer, netbook computer, personal computer (PC), personal digital assistant (PDA), smart phone, wearable device (e.g., smart watch, personal fitness device, personal safety device), or any programmable computer system known in the art with an interactive display. Client device 404 includes user interface 420 and may include a client based automatic testing program, not illustrated in FIG. 4. In general, client device 404 is representative of any programmable electronic device or combination of programmable electronic devices capable of executing machine-readable program instructions and communicating with users of other electronic devices via network 408. Client device 404 may include components, as depicted and described in further detail with respect to FIG. 6, in accordance with embodiments of the present invention.

ATE 406 includes embedded microcontroller 412 and connector 414, where connector 414 allows for sending and receiving of information between embedded microcontroller 412 and client device 404. Embedded microcontroller 412 is electrically connected to DUT 110 and is capable of sending and receiving readings from DUT 110.

Embedded microcontroller 412 includes ATE program 410 for automatic testing of DUT 110. ATE program 410 has the ability to execute flowchart 250 (see FIG. 2). In an alternative embodiment, microcontroller 412 includes the above-discussed steps of ATE program 410 in the form of control logic.

Client device 404 also includes user interface (UI) 420 and various programs (not shown). Examples of the various programs on client device 404 include: a web browser, an e-mail client, security software (e.g., a firewall program, a geo-locating program, an encryption program, etc.), an instant messaging (IM) application (app), and a communication (e.g., phone) application. In an example, a user of client device 404 can interact with user interface 420, such as a touch screen (e.g., display) that performs both input to a graphical user interface (GUI) and as an output device (e.g., a display) presenting a plurality of icons associated with software applications or images depicting the executing software application. Optionally, a software application (e.g., a web browser) can generate user interface 420 operating within the GUI of client device 404. User interface 420 accepts input from a plurality of input/output (I/O) devices including, but not limited to, a tactile sensor interface (e.g., a touch screen, a touchpad) referred to as a multi-touch display. An I/O device interfacing with user interface 420 may be connected to client device 404, which may operate utilizing wired (e.g., USB port) or wireless network communications (e.g., infrared, NFC, etc.).

In general, network 408 can be any combination of connections and protocols that will support communications between client device 404 and ATE 406. Network 408 can include, for example, a local area network (LAN), a wide area network (WAN), such as the internet, a cellular network, or any combination of the preceding, and can further include wired, wireless, and/or fiber optic connections. In one embodiment, ATE program 410 can be a web service accessible via network 408 to a user of client device 404.

Figure 5:
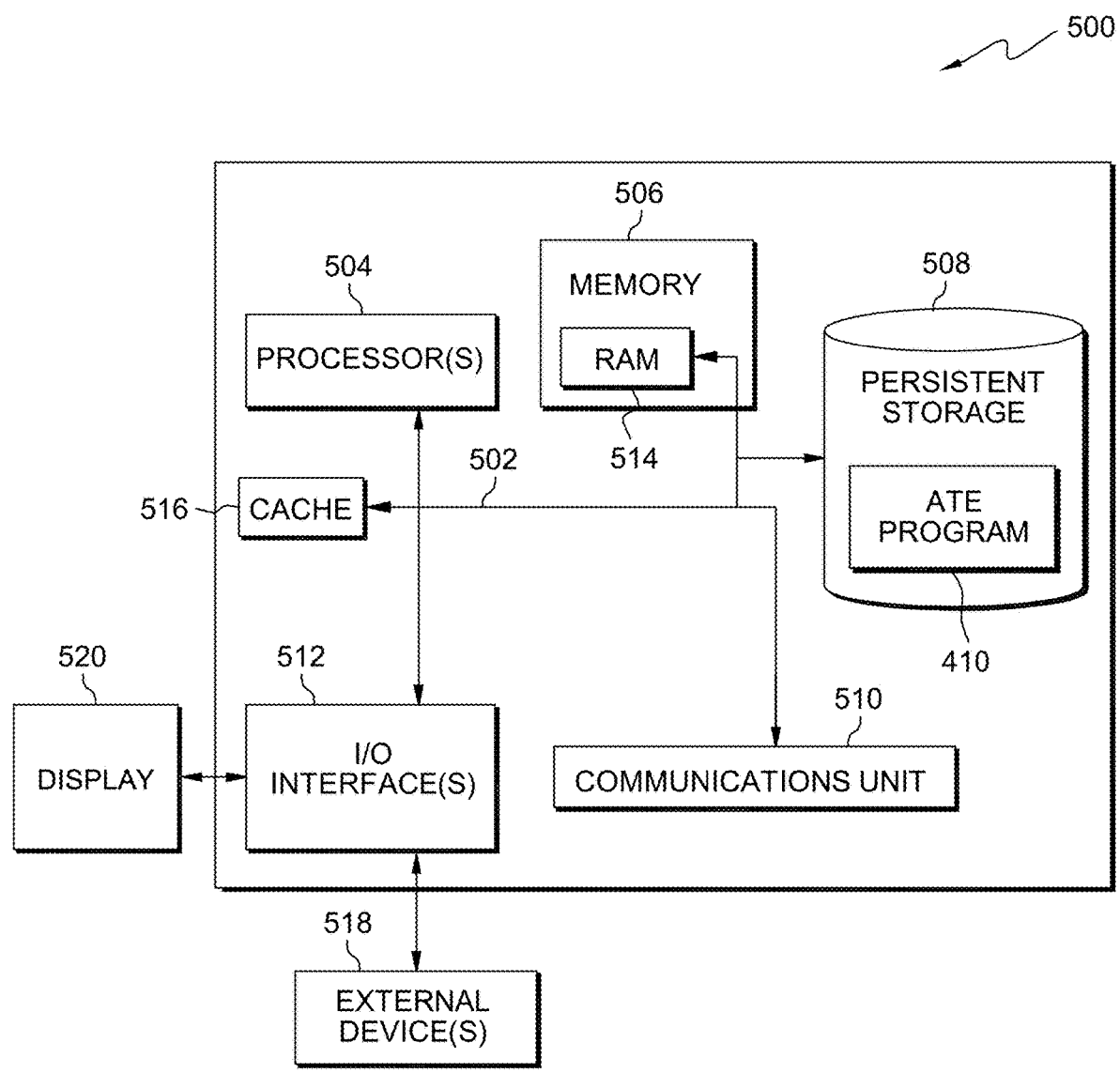
FIG. 5 depicts a block diagram of components of a computer system, such as the client device of FIG. 4, in an embodiment, in accordance with the present invention.

FIG. 5 depicts computer system 500, where embedded microcontroller 412 is an example of a system that includes ATE program 410. The computer system includes processors 504, cache 516, memory 506, persistent storage 508, communications unit 510, input/output (I/O) interface(s) 512 and communications fabric 502. Communications fabric 502 provides communications between cache 516, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses or a crossbar switch.

Memory 506 and persistent storage 508 are computer readable storage media. In this embodiment, memory 506 includes random access memory 514 (RAM). In general, memory 506 can include any suitable volatile or non-volatile computer readable storage media. Cache 516 is a fast memory that enhances the performance of processors 504 by holding recently accessed data, and data near recently accessed data, from memory 506.

Program instructions and data used to practice embodiments of the present invention may be stored in persistent storage 508 and in memory 506 for execution by one or more of the respective processors 504 via cache 516. In an embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Program instructions and data used to practice embodiments of the present invention may be downloaded to persistent storage 508 through communications unit 510.

I/O interface(s) 512 allows for input and output of data with other devices that may be connected to each computer system. For example, I/O interface 512 may provide a connection to external devices 518 such as a keyboard, keypad, a touch screen, and/or some other suitable input device. External devices 518 can also include portable computer readable storage media such as, for example, thumb drives, portable optical or magnetic disks, and memory cards. Software and data used to practice embodiments of the present invention can be stored on such portable computer readable storage media and can be loaded onto persistent storage 508 via I/O interface(s) 512. I/O interface(s) 512 also connect to display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method, comprising:
switching a device under test (DUT) to a functional test mode;
receiving, by the DUT, via a scan-in pin of a parallel scan design interface, a scan design pattern;
translating, by the DUT, the received scan design pattern into a first functional test, the first functional test having a first functional command, the received scan design pattern identifying of a part of the DUT to be tested by referencing an address register, and the received scan design pattern identifying data to be used by the first functional command as input by referencing a data register;
executing, by the DUT, the first functional test, wherein a state machine controls the execution of the first functional test; and
sending, by the DUT, via a scan-out pin of the parallel scan design interface, output data corresponding to the first functional test to an automatic test equipment.

2. The method of claim 1, wherein the state machine further controls an output address corresponding to the execution of the first functional test, the output data corresponding to the first functional test, and a status corresponding to the first functional test.

3. The method of claim 2, further comprising:
storing, by the DUT, the output address, the output data, and the status to the address register, the data register, and a status register, respectively; and
sending, by the DUT, via the scan-out pin of the parallel scan design interface, the output address and the status to the automatic test equipment.

4. The method of claim 1, further comprising:
receiving, by the DUT, a second functional command via a services interface; and
executing, by the DUT, a second functional test corresponding to the received second functional command, wherein the state machine controls the execution of the second functional test.

5. The method of claim 1, further comprising:
receiving, by the DUT, a second functional command via an inter-integrated circuit (I2C) interface; and
executing, by the DUT, a third functional test corresponding to the received second functional command, wherein the state machine controls the execution of the third functional test.

6. The method of claim 1, further comprising:
further translating, by the DUT, the received scan design pattern into a second functional test, the second functional test having a second functional command and an identification of data to be used by the second functional command as input;

executing, by the DUT, the second functional test, wherein the state machine controls the execution of the second functional test; and sending, by the DUT, via the scan-out pin of the parallel scan design interface, output data corresponding to the second functional test to the automatic test equipment;

wherein the receiving of the scan design pattern occurs via a single scan load.

7. A computer program product comprising:
one or more computer readable storage media; and
program instructions stored on the one or more computer readable storage media, the stored program instructions comprising:
program instructions to switch a device under test (DUT) to a functional test mode;
program instructions to receive, via a scan-in pin of a parallel scan design interface, a scan design pattern;
program instructions to translate the received scan design pattern into a first functional test, the first functional test having a first functional command, the received scan design pattern identifying of a part of the DUT to be tested by referencing an address register, and the received scan design pattern identifying data to be used by the first functional command as input by referencing a data register;
program instructions to execute the first functional test, wherein a state machine controls the execution of the first functional test; and
program instructions to send, via a scan-out pin of the parallel scan design interface, output data corresponding to the first functional test to an automatic test equipment.

8. The computer program product of claim 7, wherein the state machine further controls an output address corresponding to the execution of the first functional test, the output data corresponding to the first functional test, and a status corresponding to the first functional test.

9. The computer program product of claim 8, the stored program instructions further comprising:
program instructions to store the output address, the output data, and the status the address register, the data register, and a status register, respectively; and
program instructions to send, via the scan-out pin of the parallel scan design interface, the output address and the status to the automatic test equipment.

10. The computer program product of claim 7, the stored program instructions further comprising:
program instructions to receive a second functional command via a services interface; and
program instructions to execute a second functional test corresponding to the received second functional command, wherein the state machine controls the execution of the second functional test.

11. The computer program product of claim 7, the stored program instructions further comprising:
program instructions to receive a second functional command via an inter-integrated circuit (I2C) interface; and
program instructions to execute a third functional test corresponding to the received second functional command, wherein the state machine controls the execution of the third functional test.

12. The computer program product of claim 7, the stored program instructions further comprising:
program instructions to further translate the received scan design pattern into a second functional test, the second functional test having a second functional command and an identification of data to be used by the second functional command as input;
program instructions to execute the second functional test, wherein the state machine controls the execution of the second functional test; and
program instructions to send, via the scan-out pin of the parallel scan design interface, output data corresponding to the second functional test to the automatic test equipment;
wherein the receiving of the scan design pattern occurs via a single scan load.

13. A computer system comprising:
one or more computer processors;
one or more computer readable media; and
program instructions, stored on the one or more computer readable media for execution by at least one of the one or more processors, the stored program instructions comprising:
program instructions to switch a device under test (DUT) to a functional test mode; program instructions to receive, via a scan-in pin of a parallel scan design interface, a scan design pattern;
program instructions to translate the received scan design pattern into a first functional test, the first functional test having a first functional command, the received scan design pattern identifying of a part of the DUT to be tested by referencing an address register, and the received scan design pattern identifying data to be used by the first functional command as input by referencing a data register;
program instructions to execute the first functional test, wherein a state machine controls the execution of the first functional test; and
program instructions to send, via a scan-out pin of the parallel scan design interface, output data corresponding to the first functional test to an automatic test equipment.

14. The computer system of claim 13, wherein the state machine further controls an output address corresponding to the execution of the first functional test, the output data corresponding to the first functional test, and a status corresponding to the first functional test.

15. The computer system of claim 14, the stored program instructions further comprising:
program instructions to store the output address, the output data, and the status to the address register, the data register, and a status register, respectively; and
program instructions to send, via the scan-out pin of the parallel scan design interface, the output address and the status to the automatic test equipment.

16. The computer system of claim 13, the stored program instructions further comprising:
program instructions to receive a second functional command via a services interface; and
program instructions to execute a second functional test corresponding to the received second functional command, wherein the state machine controls the execution of the second functional test.

17. The computer system of claim 13, the stored program instructions further comprising:
program instructions to receive a second functional command via an inter-integrated circuit (I2C) interface; and
program instructions to execute a third functional test corresponding to the received second functional command, wherein the state machine controls the execution of the third functional test.

* * * * *